United States Patent
Nakayama et al.

(10) Patent No.: US 8,120,948 B2
(45) Date of Patent: Feb. 21, 2012

(54) DATA WRITING METHOD FOR MAGNETORESISTIVE EFFECT ELEMENT AND MAGNETIC MEMORY

(75) Inventors: Masahiko Nakayama, Yokohama (JP); Hisanori Aikawa, Yokohama (JP); Tsuneo Inaba, Kamakura (JP); Kenji Tsuchida, Kawasaki (JP); Sumio Ikegawa, Yokohama (JP); Hiroaki Yoda, Sagamihara (JP); Naoharu Shimomura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 261 days.

(21) Appl. No.: 12/561,495

(22) Filed: Sep. 17, 2009

(65) Prior Publication Data
US 2010/0073998 A1    Mar. 25, 2010

(30) Foreign Application Priority Data
Sep. 25, 2008    (JP) .................... 2008-246719

(51) Int. Cl.
*G11C 11/00* (2006.01)
(52) U.S. Cl. ............ 365/158; 365/189.16; 365/189.15
(58) Field of Classification Search .......... 365/158, 365/189.16, 189.15, 171, 189.07, 189.05, 365/163, 148, 185.12, 210, 185.33, 185.11
See application file for complete search history.

(56) References Cited

U.S. PATENT DOCUMENTS

| | | | |
|---|---|---|---|
| 7,332,780 B2 * | 2/2008 | Matsuda et al. | 257/369 |
| 2004/0037110 A1 * | 2/2004 | Ooishi | 365/171 |
| 2007/0258282 A1 * | 11/2007 | Ueda et al. | 365/158 |
| 2008/0037314 A1 * | 2/2008 | Ueda | 365/158 |
| 2008/0205131 A1 * | 8/2008 | Guo | 365/173 |
| 2009/0323446 A1 * | 12/2009 | Zhang et al. | 365/201 |

FOREIGN PATENT DOCUMENTS

| | | |
|---|---|---|
| JP | 2007-310949 | 11/2007 |
| WO | WO 2009/128485 A1 | 10/2009 |

OTHER PUBLICATIONS

Hiroyuki Tomita et al., "Single-Shot Measurement of Spin-Transfer Switching in CoFeB/MgO/CoFeB Magnetic Tunnel Junctions", Applied Physics Express 1 (2008) 061303, 2008 The Japan Society of Applied Physics, 3 pages.

* cited by examiner

*Primary Examiner* — Dang Nguyen
(74) *Attorney, Agent, or Firm* — Oblon, Spivak, McClelland, Maier & Neustadt, L.L.P.

(57) ABSTRACT

A data writing method for a magnetoresistive effect element of an aspect of the present invention including generating a write current in which a falling period from the start of a falling edge to the end of the falling edge is longer than a rising period from the start of a rising edge to the end of the rising edge, and flowing the write current through the magnetoresistive effect element which comprises a first magnetic layer having an invariable magnetizing direction, a second magnetic layer having a variable magnetizing direction, and a tunnel barrier layer provided between the first magnetic layer and the second magnetic layer, to change the magnetizing direction of the second magnetic layer.

10 Claims, 8 Drawing Sheets

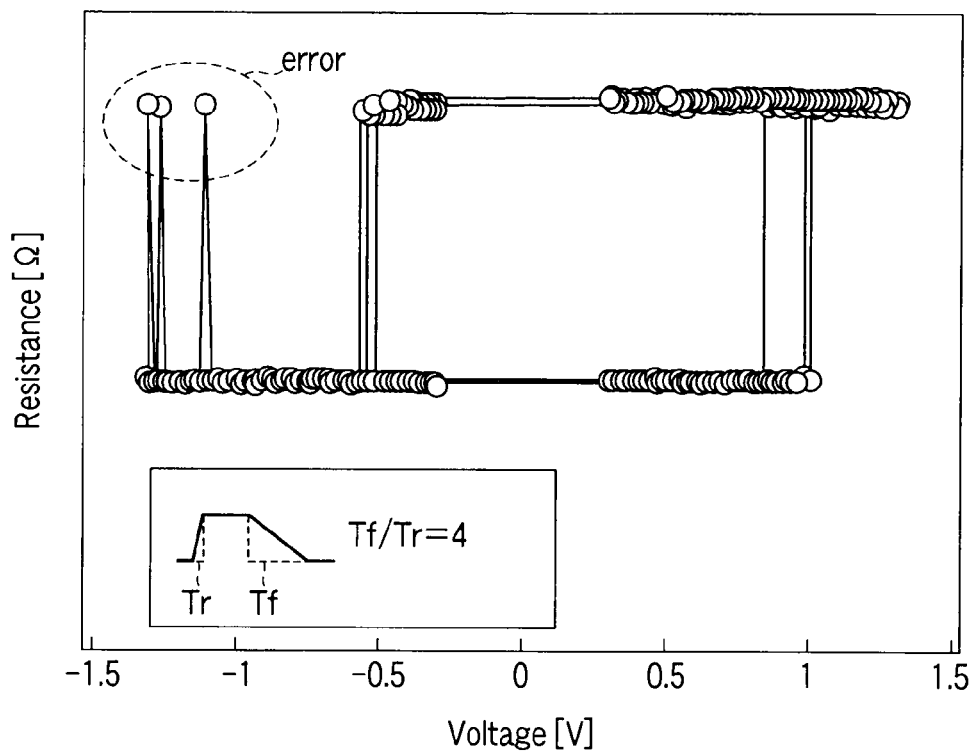
F I G. 5A
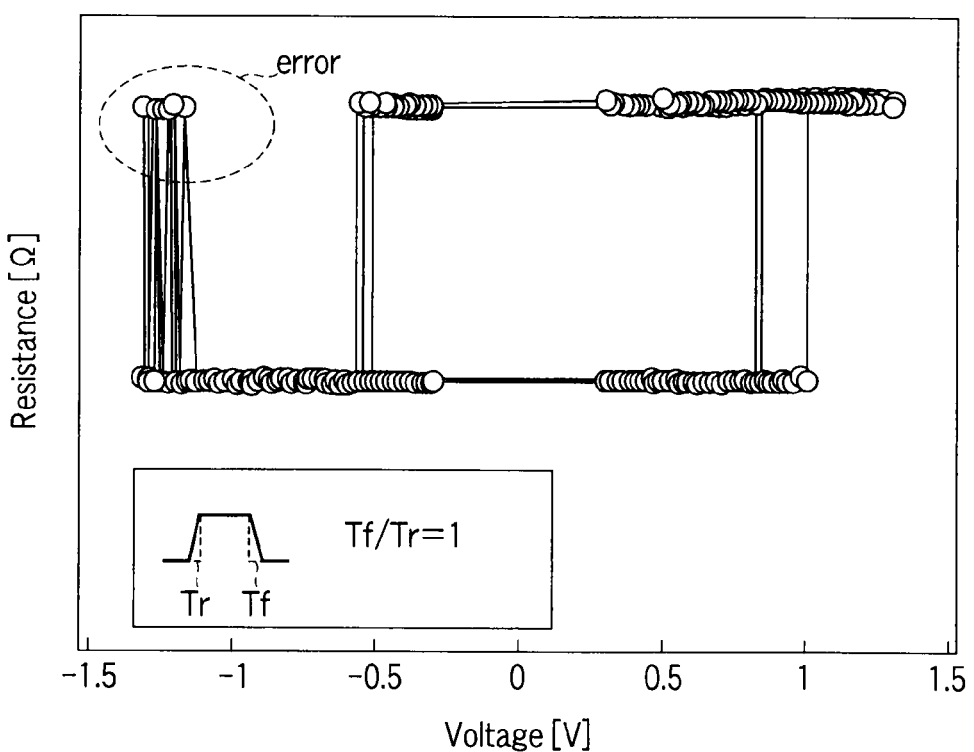
F I G. 5B

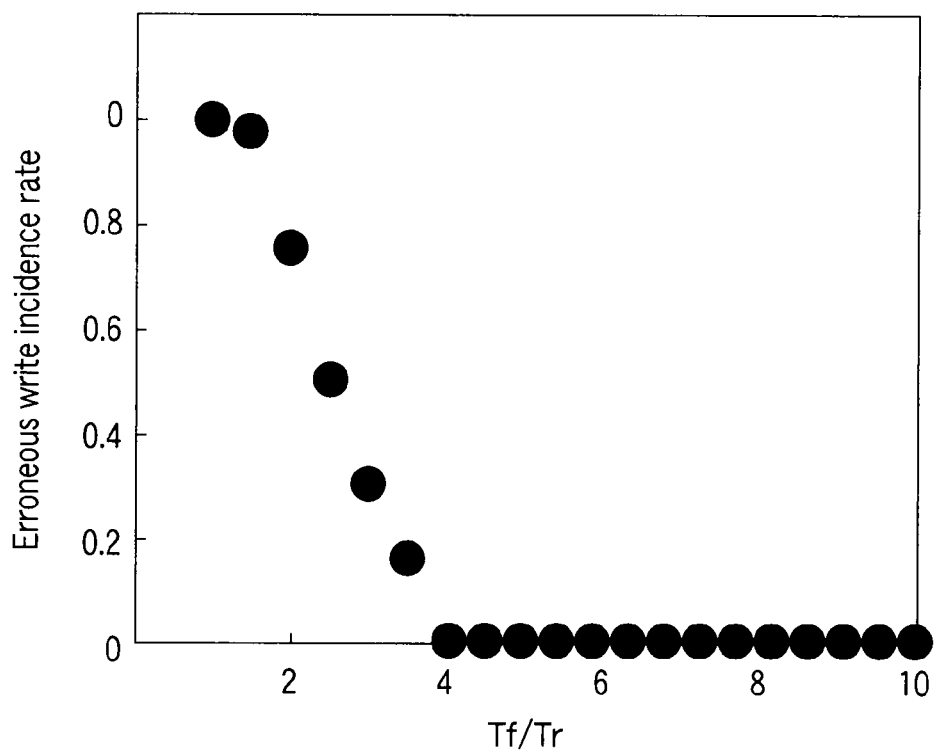
F I G. 6
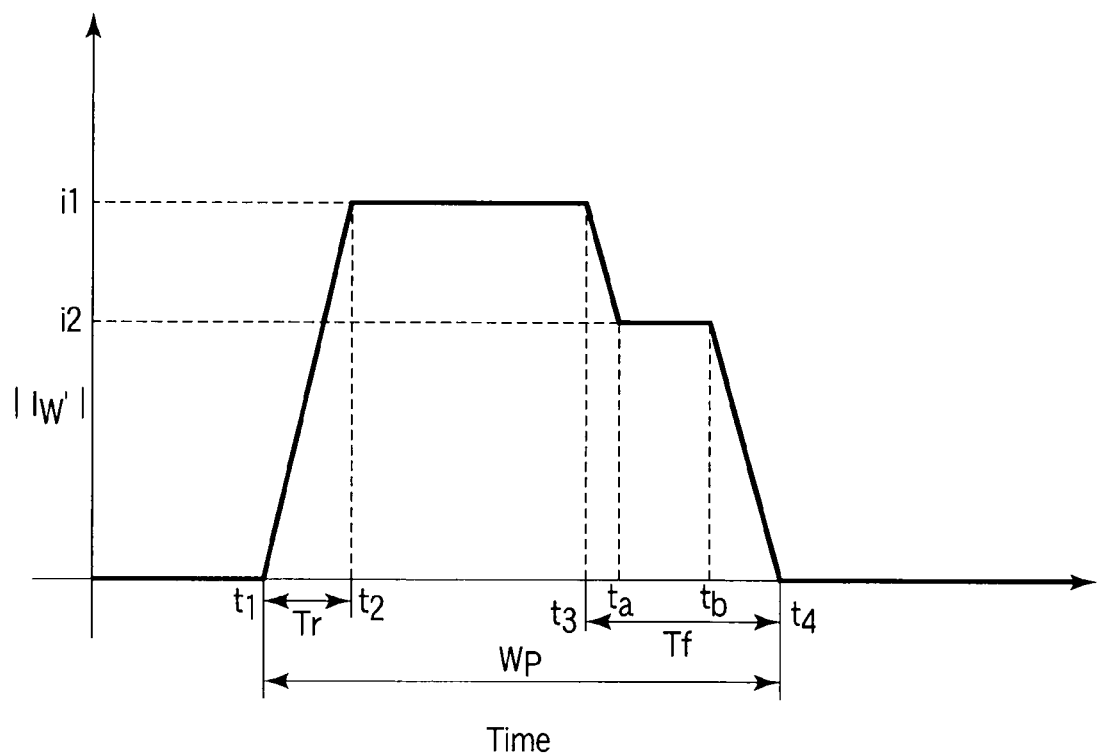
F I G. 7

DATA WRITING METHOD FOR MAGNETORESISTIVE EFFECT ELEMENT AND MAGNETIC MEMORY

CROSS-REFERENCE TO RELATED APPLICATIONS

This application is based upon and claims the benefit of priority from prior Japanese Patent Application No. 2008-246719, filed Sep. 25, 2008, the entire contents of which are incorporated herein by reference.

BACKGROUND OF THE INVENTION

1. Field of the Invention

The present invention relates to a data writing method for a magnetoresistive effect element, and a magnetic memory.

2. Description of the Related Art

Various types of solid-state magnetic memories have been suggested heretofore. In recent years, a magnetoresistive effect memory using a magnetoresistive effect element which demonstrates a giant magnetoresistive (GMR) effect has been suggested. Among others, a magnetoresistive random access memory (MRAM) using ferromagnetic tunnel junction which demonstrates a tunneling magnetoresistive (TMR) effect attracts attention in particular.

A basic structure of an MTJ (magnetic tunnel junction) element of the ferromagnetic tunnel junction is a three-layer structure including a first ferromagnetic layer, an insulating layer, and a second ferromagnetic layer. Electrons tunnel into the insulating layer due to a magnetization, and a current flows through the magnetoresistive effect element. A junction resistance value of the MTJ element varies in accordance with a cosine of a relative angle of the magnetizations of the first and second ferromagnetic layers. Therefore, the junction resistance value becomes a minimal value when the magnetizations of the first and second ferromagnetic layers are parallel, and it becomes a maximal value when they are anti-parallel. This is called a TMR effect. A change in resistance value due to the TMR effect may exceed 300% at room temperature in some cases.

When the MTJ element is used for magnetoresistive effect memory, at least one ferromagnetic layer is regarded as a magnetization invariable layer (which is also referred to as a base layer, a reference layer, or a fixed layer) to fix a magnetizing direction thereof, and the other ferromagnetic layer is determined as a magnetization variable layer (which is also referred to as a free layer, or a recording layer). In such an MTJ element, "0" or "1" as binary information is associated with a state that magnetizing directions of the magnetization invariable layer and the magnetization variable layer are parallel or a state that they are anti-parallel, information (data) is stored in the MTJ element.

As one of the data writing schemes, there is a scheme of flowing a current through a write interconnect line provided separately from a memory cell and reversing the magnetization of the magnetization variable layer based on a magnetic field generated from this current. Such a writing scheme is called a current magnetic field writing scheme. As a writing scheme different from the current magnetic field writing scheme, there is a spin transfer magnetization reversal scheme. According to the spin transfer magnetization reversal scheme, directly flowing a current through an element enables reversing the magnetization of the magnetization variable layer based on a spin torque injected from the magnetization invariable layer.

Data is read by flowing a current through the ferromagnetic tunnel junction and detecting a difference in resistances of an element caused due to the TMR effect.

A memory cell array in a MRAM is formed by arranging many memory cells each including an MTJ element. As a configuration of the memory cell, a select transistor is provided in each memory cell like, e.g., a DRAM so that an arbitrary MTJ element can be selected. Further, a peripheral circuit is incorporated in the same chip as the memory cell array.

To realize a memory having a large storage capacity, the element must be miniaturized, and a cell share ratio in the chip must be increased. The spin transfer reversal scheme is characterized in that the element can be miniaturized as compared with the current magnetic field writing scheme, and it is anticipated as a writing scheme suitable for realizing a MRAM having a large storage capacity.

In a MRAM using the spin transfer magnetization reversal scheme, element characteristics of the MTJ element fluctuate (see, e.g., H. Tomita et al., Appl. Phys. Express 1 (2008) 061303). When an excessive write current equal to or above a threshold reversing value is supplied to the MTJ element, there occurs a problem of an erroneous writing phenomenon that data written in the MTJ element is lost before the write current falls, and unintended data is thereby written.

BRIEF SUMMARY OF THE INVENTION

A data writing method for a magnetoresistive effect element of an aspect of the present invention comprising: generating a write current in which a falling period from the start of a falling edge to the end of the falling edge is longer than a rising period from the start of a rising edge to the end of the rising edge; and flowing the write current through the magnetoresistive effect element which comprises a first magnetic layer having an invariable magnetizing direction, a second magnetic layer having a variable magnetizing direction, and a tunnel barrier layer provided between the first magnetic layer and the second magnetic layer, to change the magnetizing direction of the second magnetic layer.

A magnetic memory of an aspect of the present invention comprising: a plurality of memory cells each including a magnetoresistive effect element which comprises a first magnetic layer having an invariable magnetizing direction, a second magnetic layer having a variable magnetizing direction, and a tunnel barrier layer provided between the first magnetic layer and the second magnetic layer; and a write circuit which includes a write current generation circuit that generates a write current to change the magnetizing direction of the second magnetic layer, and which flows the write current through the magnetoresistive effect element bidirectionally, wherein the write circuit flows the write current in which a falling period from the start of a falling edge to the end of the falling edge is longer than a rising period from the start of a rising edge to the end of the rising edge.

BRIEF DESCRIPTION OF THE SEVERAL VIEWS OF THE DRAWING

FIGS. 5A, 5B and 6 are views, each showing a verification result of the embodiment;

FIG. 7 is a view showing a waveform of a write current in the embodiment;

DETAILED DESCRIPTION OF THE INVENTION

A mode for carrying out an example of the present invention will now be described in detail hereinafter with reference to the accompanying drawings.

[Outline]

According to an embodiment of the present invention, a data writing method for a magnetoresistive effect element will be described.

This embodiment relates to a data writing method adopting a so-called spin transfer magnetization reversal scheme that flows a write current having spin-polarized electrons through a magnetoresistive effect element to change a relative magnetizing direction of two magnetic layers constituting the magnetoresistive effect element.

The write current used in this embodiment according to the present invention is characterized in that a falling period of the write current is longer than a rising period of the write current.

In a regular write operation, when an excessive write current flows through the magnetoresistive effect element, thermal disturbance occurs, whereby data may be erroneously written in some cases.

However, when the falling period is prolonged, as in this embodiment, a normal data write state/conditions are compensated during the falling period, and a thermally unstable state is suppressed.

Therefore, the occurrence of erroneous writing due to an excessive write current can be reduced.

Since a threshold reversing current fluctuates in a magnetoresistive effect memory (e.g., a magnetoresistive random access memory) having a plurality of magnetoresistive effect elements included in a memory cell array, applying the data writing method according to the embodiment of the present invention to the magnetic memory (magnetoresistive effect memory) is effective.

A configuration and a verification result of the embodiment according to the present invention will now be more specifically described hereinafter.

Embodiment (1) Basic Example

A basic example of the embodiment according to the present invention will now be described with reference to FIGS. 1 to 3.

First, a configuration of a magnetoresistive effect element will be explained with reference to FIGS. 1 and 2.

Figure 1:
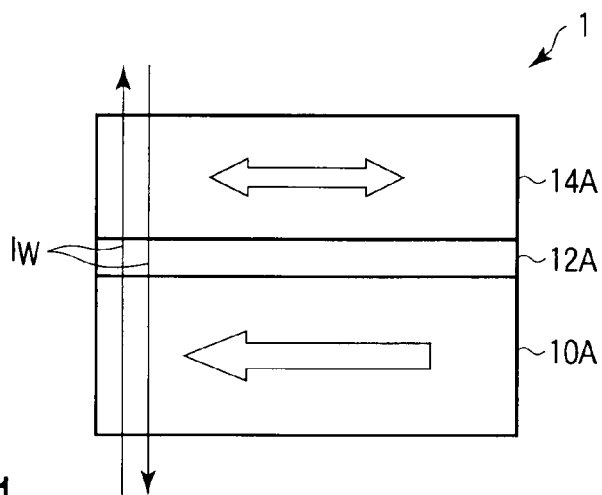
FIGS. 1 and 2 are views, each showing a basic configuration of a magnetoresistive effect element.
Figure 2:
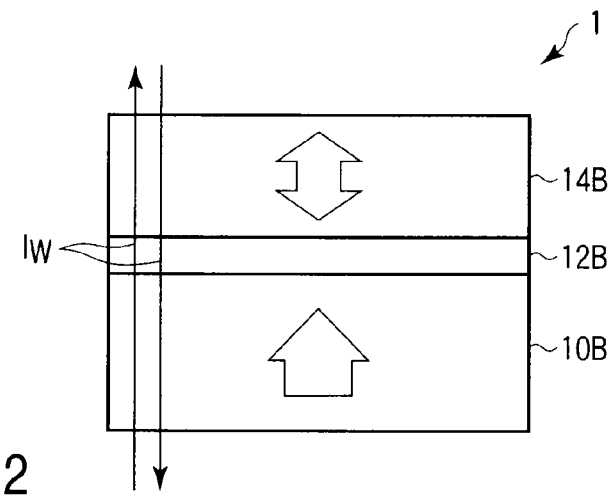

Each of FIGS. 1 and 2 shows a cross-sectional configuration of a magnetoresistive effect element 1. The magnetoresistive effect element 1 depicted in each of FIGS. 1 and 2 is, e.g., an MTJ (Magnetic Tunnel Junction) element 1.

The magnetoresistive effect element 1 depicted in FIG. 1 has a laminated structure having a first magnetic layer (e.g., a ferromagnetic layer or a laminated ferrimagnetic layer) 10A, a second magnetic layer (e.g., a ferromagnetic layer or a laminated ferrimagnetic layer) 14A, and a tunnel barrier layer 12A sandwiched between the first magnetic layer 10A and the second magnetic layer 14A. The MTJ element 1 depicted in FIG. 1 is an in-plane magnetization type magnetoresistive effect element in which a magnetizing direction of each of the first and second magnetic layers 10A and 14A faces a parallel direction with respect to a film surface.

In the in-plane magnetization type magnetoresistive effect element 1, as a material forming the first and second magnetic layers 10B and 14B, the following ferromagnetic material is used. For example, there is a single-layer film containing one of Fe, Co, and Ni, a laminated film containing these substances, a laminated ferrimagnetic layer containing these substances, or an alloy containing these substances. Further, an oxide such as magnetite having a large spin polarization, $CrO_2$, or $RXMnO_3$—Y (R: a rare earth, X: Ca, Ba, or Sr) or a Heusler alloy such as NiMnSb or PtMnSb may be used.

Furthermore, in the in-plane magnetization type magnetoresistive effect element 1, as a material of the tunnel barrier layer 12A, for example, $Al_2O_3$, $SiO_2$, MgO, AlN, $Bi_2O$, $MgF_2$, or $SrTiO_2$ is used.

The magnetoresistive effect element 1 depicted in FIG. 2 has a laminated structure having a first magnetic layer (e.g., a ferromagnetic layer) 10B, a second magnetic layer (e.g., a ferromagnetic layer) 14B, and a tunnel barrier layer 12B sandwiched between the first magnetic layer 10B and the second magnetic layer 14B like the configuration depicted in FIG. 1. However, the magnetoresistive effect element 1 depicted in FIG. 2 is a perpendicular magnetization type MTJ element in which a magnetizing direction of each of the first and second magnetic layers 10B and 14B faces a direction perpendicular to a film surface.

In the perpendicular magnetization type magnetoresistive effect element 1, as a material forming the first and second magnetic layers 10B and 14B, for example, one of a disordered alloy, an ordered alloy, an intermetallic compound, an artificial lattice, and a ferrimagnetic substance is used. More specific examples follow.

As the disordered alloy, there is an alloy which contains Co as a main component and also contains one or more elements selected from Cr, Ta, Nb, V, W, Hf, Ti, Zr, Pt, Pd, Fe, and Ni such as a CoCr alloy, a CoPt alloy, a CoCrPt alloy, a CoCrNb alloy, or CoCrPtTa alloy. As the ordered alloy or the metallic compound, there is an alloy or a compound which contains one or more elements selected from Fe, Co, and Ni and one or more elements selected from Pt and Pd such as $Fe_{50}Pt_{50}$, $Fe_{50}Pd_{50}$, $Co_{50}Pt_{50}$, or $Fe_{30}Ni_{20}Pt_{50}$, or an alloy in which a crystal structure of the alloy or the metallic compound is of an L10 type, for example. As the artificial lattice, there is a structure in which a metal containing one element alone selected from Fe, Co, and Ni or an alloy containing one or more elements selected from the same and a metal containing one element alone selected from Cr, Pt, Pd, Ir, Rh, Ru, Os, Re, Au, and Cu or an alloy containing one or more elements selected from the same are alternately laminated. Moreover, as the ferrimagnetic substance, there is an alloy of a rare-earth metal and a transition metal such as TbFe, DyTb, or GdTbCo.

Additionally, in the perpendicular magnetization type magnetoresistive effect element 1, as a material of the tunnel barrier layer 12B, an oxide, e.g., MgO or $Al_2O_3$ is mainly used.

It is to be noted that a single-junction structure having a single tunnel barrier layer is shown as an example in FIGS. 1 and 2, but a double-junction structure having two tunnel barrier layers can be adopted. Alternatively, a plane shape of the in-plane magnetization type magnetoresistive effect element 1 depicted in FIG. 1 has, e.g., a square shape, a rectangular shape, an elliptic shape, a circular shape, a hexagonal shape, a rhomboid shape, a parallelogram shape, a cruciform shape, or a bean shape (a concave shape) to utilize shape magnetic anisotropy.

One of the first and second magnetic layers 10A and 10B or 14A and 14B constituting the magnetoresistive effect element 1 depicted in FIG. 1 or 2 is a magnetic layer having an invariable magnetizing direction (which is also called a reference layer or a magnetization invariable layer), and the other is a magnetic layer having a variable magnetizing direction (which is also called a storage layer or a magnetization free layer). Here, the reference layer means a layer in which magnetization is invariable before and after flowing a write current. In the examples depicted in FIGS. 1 and 2, the first magnetic layers 10A and 10B are reference layers 10A and 10B. The second magnetic layers 14A and 14B are storage layers 14A and 14B. Incidentally, it is preferable for the magnetization of each of the reference layers 10A and 10B to be larger than the magnetization of each storage layer 14A and 14B. Therefore, the in-plane magnetization type magnetoresistive effect element 1 may further include an exchange bias layer (an antiferromagnetic layer) which is used to fix the magnetizing direction of the reference layer 10A based on exchange coupling, and the reference layer 10A may be sandwiched between the exchange bias layer and the tunnel barrier layer 12A. When the first magnetic layers 10A and 10B are the reference layers, this configuration is called a top free type. When the second magnetic layers 14A and 14B are the reference layers, this configuration is called a bottom free type.

The magnetoresistive effect element 1 can take two steady states, and binary data is stored by associating one of the steady states with data "0" and associating the other with data "1". One of the two steady states is a parallel (P: parallel) state in which the magnetizing direction of the reference layer 10A or 10B and the magnetizing direction of the storage layer 14A or 14B face the same direction, and the other is an anti-parallel (AP: Anti Parallel) state in which the magnetizing direction of the reference layers 10A or 10B and the magnetizing direction of the storage layer 14A or 14B face opposite directions.

In the magnetoresistive effect element 1, the steady state thereof can be changed by using a write current having spin-polarized electrons as a current Iw and flowing this current Iw through an element (a tunnel junction). It is to be noted that the electrons subjected to spin polarization (which will be referred to as spin-polarized electrons hereinafter) flow in a direction opposite to a direction of the write current.

When the write current Iw flows to the reference layer 10A or 10B from the storage layer 14A or 14B, the spin-polarized electrons are injected into the storage layer 14A or 14B from the reference layer 10A or 10B, and the magnetizing direction of the reference layer 10A or 10B and the magnetizing direction of the storage layer 14A or 14B enter the parallel state.

On the other hand, when the write current Iw is flowed from the reference layer 10A or 10B to the storage layer 14A or 14B, the spin-polarized electrons flow from the storage layer 14A or 14B to the reference layer 10A or 10B, and the spin-polarized electrons having a parallel spin to the reference layer 10A or 10B pass through the reference layer 10A or 10B, and the electrons having an anti-parallel spin are reflected. As a result, the magnetizing direction of the storage layer 14A or 14B and the magnetizing direction of the reference layer 10A or 10B enter the anti-parallel state.

It is to be noted that a current which is required to set a relationship between the magnetizing directions of the reference layer and the storage layer from the parallel (P) state to the anti-parallel (AP) state or set the relationship between the magnetizing directions of the reference layer and the storage layer from the anti-parallel (AP) state to the parallel (P) state with respect to a given magnetoresistive effect element is called a threshold reversing current.

Figure 3:
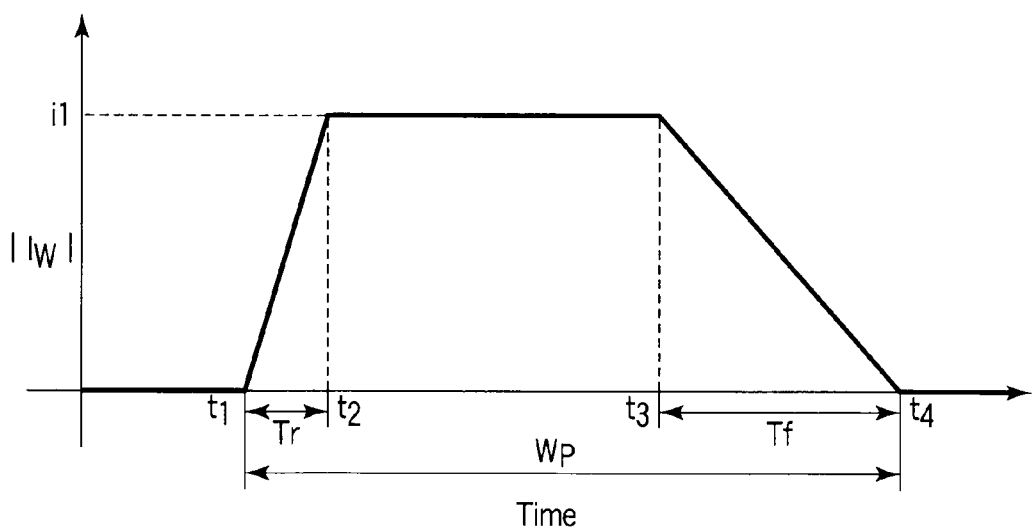
FIG. 3 is a view showing a waveform of a write current in an embodiment.

FIG. 3 shows a waveform of the write current which is used to write data with respect to the magnetoresistive effect element. In FIG. 3, the write current Iw is represented by an absolute value. It is to be noted that the write current has a positive polarity when the write current Iw is flowed from the storage layer 14A or 14B to the reference layer 10A or 10B, for example.

As shown in FIG. 3, the write current Iw is a pulse current having a pulse width $W_P$, and a length of a rising period Tr of the pulse current is different from a length of a falling period Tf of the pulse current.

Here, in this embodiment, the rising period Tr of the pulse current as the write current represents a period required for a current value of the pulse current to reach a predetermined current value (a current value i1 in this example) from 0 A (0 $J/cm^2$). In FIG. 3, the pulse current starts rising from 0 A at a time $t_1$ (which will be referred to as a rising start time) and reaches the predetermined current value i1 at a time $t_2$ (which will be referred to as a rising end time) to terminate the rising of the write current.

Further, in this embodiment, the falling period Tf of the pulse current as the write current represents a period required for the current value of the pulse current to reach 0 A (0 $J/cm^2$) from the predetermined current value i1. In FIG. 3, the pulse current starts falling from the current value i1 which is output constant from the rising end time $t_2$ at a time $t_3$ (which will be referred to as a falling start time), and the pulse current becomes 0 A at a time $t_4$ (which will be referred to as a falling end time) to terminate the falling of the current.

In the embodiment according to the present invention, the write current Iw which is utilized to write data in the magnetoresistive effect element is characterized in that its falling period Tf is longer than its rising period Tr.

Figure 4:
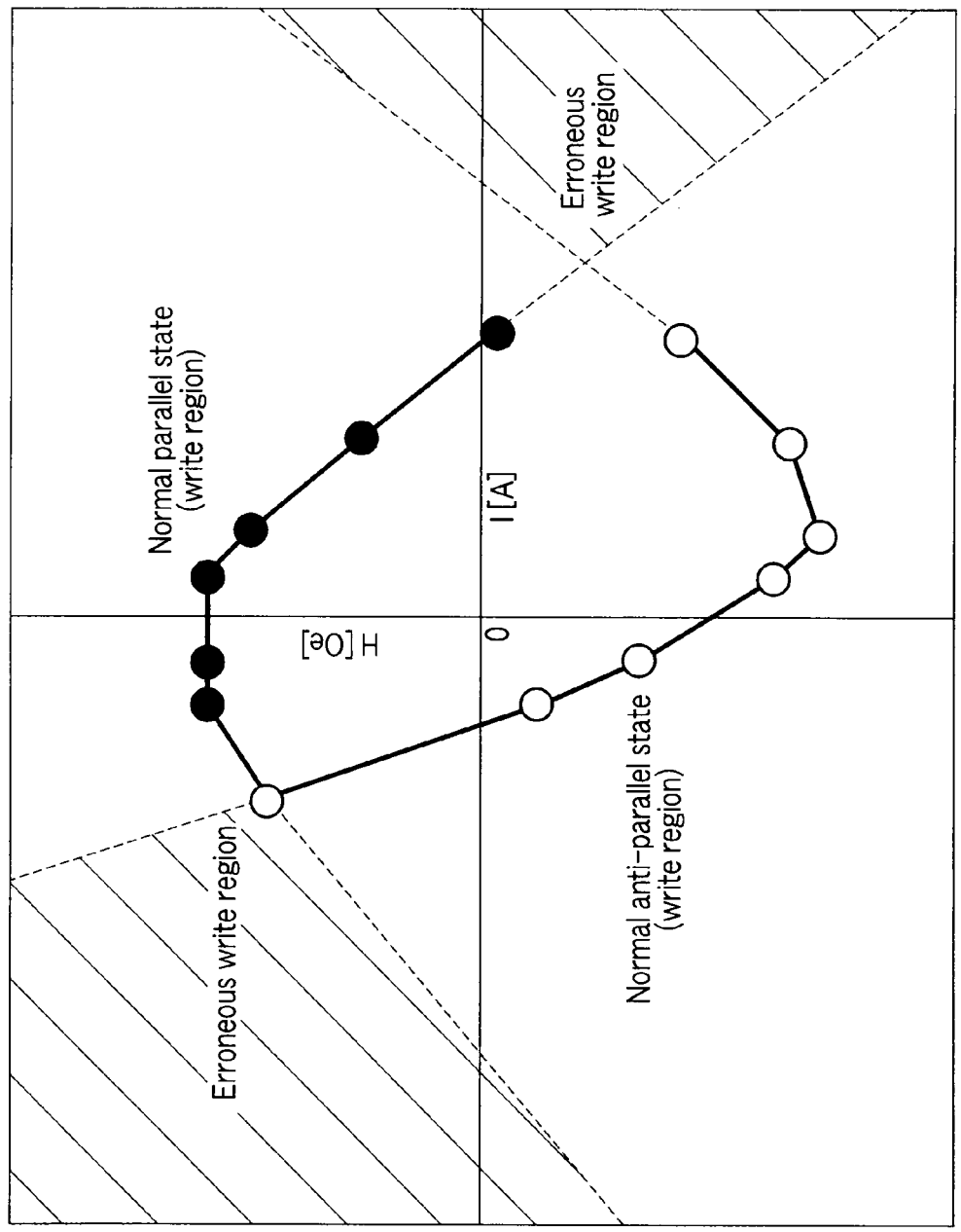
FIG. 4 is a magnetic phase diagram of the magnetoresistive effect element when writing data.

FIG. 4 is a magnetic phase diagram when writing data in a given magnetoresistive effect element based on the spin transfer magnetization reversal scheme. It is to be noted that FIG. 4 shows a relationship between an external magnetic field H and a spin-polarized current I which is flowed through the magnetoresistive element when writing data.

In FIG. 4, in the magnetoresistive effect element, the magnetizing direction of the storage layer is reversed to become anti-parallel to the magnetizing direction of the reference layer by using the write current flowing in a negative direction in a state where the external magnetic field is 0. Furthermore, in the magnetoresistive effect element, the magnetizing direction of the storage layer is reversed to become parallel to the magnetizing direction of the reference layer by using the write current flowing in a positive direction in the state where the external magnetic field is 0. Usually, data is written in the magnetoresistive effect element by using the write current in a write region.

Here, a problem that occurs when writing data is presence of an erroneous write region when a current I is increased. The erroneous write region is a region where an incidence rate of erroneous writing in the magnetoresistive effect element is high, and it is a shaded region in FIG. 4.

When a current value of the write current rises and the current (the current value) enters the erroneous write region, the magnetization of the magnetoresistive effect element faces an angle associated with data to be stored, but the magnetic layer (the storage layer 14A or 14B) in the magnetoresistive effect element enters a thermally unstable state. When the write current precipitously falls and a spin-polarized current (a threshold reversing current) is no longer present in this thermally unstable state, the magnetic layer is greatly affected by thermal disturbance, and erroneous writing occurs.

When considering a magnetoresistive effect memory having a memory cell array including a plurality of magnetoresistive effect elements, since characteristics of the magnetoresistive effect elements fluctuate, elements each having a large threshold reversing current and elements each having a small threshold reversing current are present. In this case, supplying a write current having a current value adjusted in accordance with each magnetoresistive effect element to the memory cell array is substantially impossible.

Therefore, when an excessive write current flows through each element having a small threshold reversing current, the rate of erroneous writing is high. This can cause a writing defect in a magnetoresistive effect memory (e.g., a magnetoresistive random access memory).

In the embodiment according to the present invention, the falling period Tf of the current value of the write current Iw is longer than the rising period Tr of the same.

When the falling period Tf is long in this manner, a long period during which the write current passes through a write region where a normal write state/conditions can be guaranteed can be assured at the falling edge of the write current even though the excessive write current flows through the magnetoresistive effect element during a substantial write period ($W_P$-Tr-Tf), and a magnetization state enters the erroneous write region.

That is, in this embodiment, even though a thermal disturbance occurs due to an excessive current in the magnetoresistive effect element having a small threshold reversing current, the current value which enables normal writing data can be supplied to the magnetoresistive effect element 1 during the long falling period Tf. Moreover, the thermally unstable state of the magnetoresistive effect element can be suppressed during the falling period Tf.

As a result, this embodiment increase a probability that writing is normally terminated and realize a write operation based on stable spin transfer magnetization reversal.

Therefore, according to this embodiment, stable data writing based on spin transfer magnetization reversal with less occurrence of erroneous writing realize.

Data writing in the magnetoresistive effect element using such a write current is particularly effective for a magnetoresistive effect memory having a plurality of magnetoresistive effect elements, e.g., a magnetoresistive random access memory.

(2) Verification

A verification result of the embodiment according to the present invention will now be described with reference to FIGS. 5A, 5B and 6.

FIGS. 5A and 5B show an experimental result of writing data in a given magnetoresistive effect element according to this embodiment.

FIG. 5A shows an experimental result when data is written in the magnetoresistive effect element by using a write current having a falling period Tf longer than a rising period Tr. It is to be noted that a ratio (which will be referred to as a period ratio hereinafter) Tf/Tr of the falling period Tf and the rising period Tr is Tf/Tr=4. Further, in FIG. 5B, the falling period Tf is equal to the rising period Tr. That is, FIG. 5B shows an experimental result when data is written in the magnetoresistive effect element by using a write current having a relationship Tf/Tr=1. In FIG. 5A, the rising period Tr is set to 2.5 nanoseconds and the falling period Tf is set to 10 nanoseconds, for example. In FIG. 5B, the rising period Tr and the falling period Tf are set to 2.5 nanoseconds. However, these values are just examples, and the embodiment according to the present invention is not restricted to these values.

An abscissa in each of FIGS. 5A and 5B is associated with a voltage value required to generate the write current Iw, and an ordinate in each of FIGS. 5A and 5B is associated with a change in resistance value of a given magnetoresistive effect element. The resistance value of the magnetoresistive effect element used for verification varies in the range of, e.g., 4900Ω to 5500Ω. However, the magnetoresistive effect element used for verification is just an example, and this embodiment according to the present invention is not restricted to the magnetoresistive effect element having such a resistance value range.

As shown in FIG. 5A and FIG. 5B, it was verified that the frequency of erroneous writing that occurs in the range of approximately −1 V to −1.5 V is clearly reduced by using a write current having a falling period Tf that is longer than the rising period Tr, as in this embodiment.

FIG. 6 shows the dependence of an erroneous writing incidence rate with respect to the period ratio Tf/Tr when a ratio of the falling period Tf and the rising period Tr is changed. It is to be noted that the current value (current density) which flows to the magnetoresistive effect element is fixed in an output period (a pulse width) of the write current excluding the rising period Tr and the falling period Tf in this example. Furthermore, in FIG. 6, a length of the rising period Tr is equal to a length of the falling period Tf, i.e., when the period ratio Tf/Tr is Tf/Tr=1, the erroneous writing incidence rate is "1".

As shown in FIG. 6, when the period ratio Tf/Tr becomes "1.5" or above, the erroneous writing incidence rate is precipitously reduced, and a tendency in which the erroneous writing is reduced is demonstrated by setting the falling period Tf to be longer than the rising period Tr.

When the period ratio Tf/Tr becomes approximately "2.5", the erroneous writing incidence ratio becomes approximately ½. Furthermore, when the period ratio Tf/Tr becomes "4" or above, the erroneous writing ratio becomes substantially 0.

Setting the falling period Tf of the write current Iw to be longer than the rising period Tr of the same in this manner enables reducing the occurrence of erroneous writing.

Moreover, when the ratio Tf/Tr of the falling period Tf and the rising period Tr is 2.5 or above, the occurrence of erroneous writing can be more effectively reduced. Additionally, when miniaturization of elements advances and many fluctuations in element characteristics are observed, the period ratio Tf/Tr which is 4 or above is more preferable.

Therefore, according to the embodiment of the present invention, the occurrence of erroneous writing can be reduced, and stable data writing based on spin transfer magnetization reversal can be realized.

(3) Modification

A modification of the embodiment according to the present invention will now be described with reference to FIG. 7.

In the above description, the falling period Tf is set as a period during which a given current value i1 falls to 0 A.

However, the embodiment according to the present invention is not restricted thereto, and it is sufficient for the falling period Tf from a predetermined current value to be longer than the rising period Tr.

For example, the same effects as those of the write current Iw having a waveform depicted in FIG. 3 can be obtained even though a write current Iw' having a pulse waveform shown in FIG. 7 is used.

In the write current Iw' shown in FIG. 7, falling from the current value (a first current value) i1 starts at a falling start time $t_3$ in the falling period Tf. It is to be noted that the current value i1 is output constant during a period (a first period) from a rising end time $t_2$ to the falling start time $t_3$.

The current value of the write current Iw' is caused to fall from the first current value i1 to a second current value i2 before a time $t_a$, and this current value i2 is output constantly within a period $t_a$-$t_b$ (a second period) from the time (a first time) $t_a$ to a predetermined time (a second time) $t_b$. Moreover, the current value of the write current Iw' again starts falling from the current value i2 at the time $t_b$ and becomes 0 A at a time $t_4$. Incidentally, it is preferable for the current value i2 to have a current value associated with the write region depicted in FIG. 4.

As explained above, in this modification, the current value of the write current Iw' within the falling period Tf varies to 0 A from the first current value i1 through the period $t_a$-$t_b$ where the second current value i2 is output constantly.

In this case, the falling period Tf of the write current Iw' is likewise longer than the rising period Tr, and the same effect as that in the example depicted in FIG. 3 can be obtained.

Additionally, as in this modification, when the period $t_a$-$t_b$ in which the fixed current value i2 is output is provided in the falling period Tf, a more stable state/conditions can be assured with respect to the magnetoresistive effect element during the falling period Tf.

It is to be noted that the case where the current value of the write current is reduced to the current value i2 that is output constantly from the current value i1 has been described in this modification, but the present invention is not restricted thereto, and a plurality of periods during which the current value is reduced on a plurality of stages to output a fixed current value may be provided in the falling period Tf.

(4) Application Example

An application example of the embodiment according to the present invention will now be described.

The embodiment according to the present invention is applied to a magnetoresistive effect memory, e.g., a magnetoresistive random access memory (MRAM). The MRAM includes a write circuit which flows a write current from one end to the other end, or vice-versa, of a magnetoresistive effect element, and changes a relationship between a magnetizing direction of a first magnetic layer and a magnetizing direction of a second magnetic layer by using the write current.

(a) Overall Configuration

Figure 8:
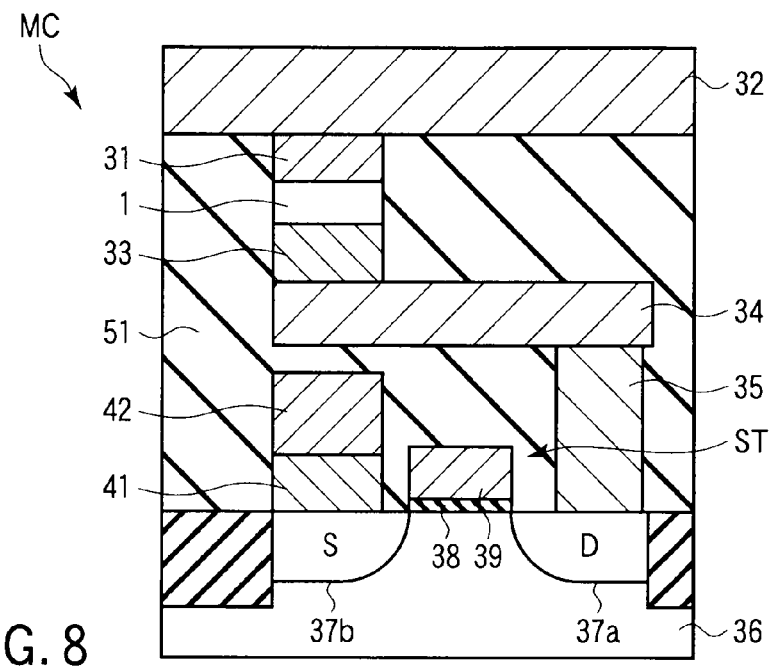
FIG. 8 is a view showing a memory cell in a magnetoresistive random access memory.

FIG. 8 shows a memory cell of a magnetoresistive random access memory.

An upper end of a magnetoresistive effect element 1 is connected with an upper bit line 32 through an upper electrode 31. Further, a lower end of the magnetoresistive effect element 1 is connected with a diffusion layer (source/drain) 37a of a select transistor ST through a lower electrode 33, an extraction electrode 34, and a plug 35.

A diffusion layer (source/drain) 37b of the select transistor ST is connected with a lower bit line 42 through a plug 41.

A gate electrode (a word line) 39 is formed on a semiconductor substrate (a channel region) 36 between the two diffusion layer 37a, 37b through a gate insulating film 38.

It is to be noted that at least one of the lower electrode 33 and the extraction electrode 34 may be omitted. For example, when omitting the lower electrode 33, the magnetoresistive effect element 1 is formed on the extraction electrode 34. Furthermore, when omitting the extraction electrode 34, the lower electrode 33 is formed on the plug 35. Moreover, when omitting the lower electrode 33 and the extraction electrode 34, the magnetoresistive effect element 1 is formed on the plug 35.

Figure 9:
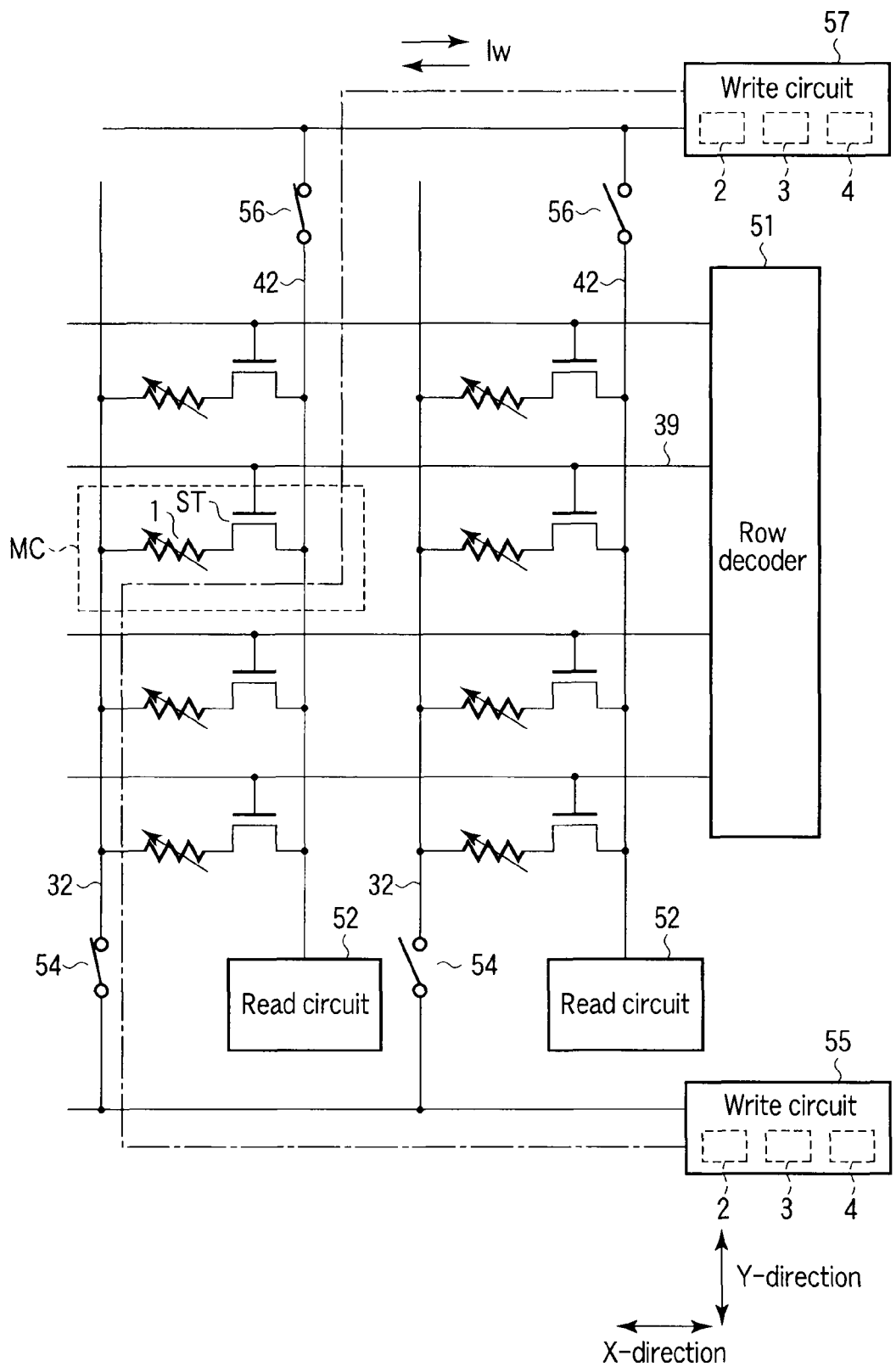
FIG. 9 is a view showing the magnetoresistive random access memory.

FIG. 9 shows a memory cell array including the memory cells MC depicted in FIG. 8. In the drawing, like reference numerals denote elements equal to those in FIG. 8.

The memory cell MC has, e.g., a configuration depicted in FIG. 8 and is arranged in an array shape.

The word line 39 is extended in an X-direction and connected with the gate electrode of the select transistor ST constituting the memory cell MC. One end of the word line 39 is connected with a row decoder 51. The row decoder 51 performs a selecting operation with respect to the word line 39.

One end of the bit line 32 is connected with a write circuit 55 through a switch circuit 54 such as a field-effect transistor (FET). The write circuit 55 includes a write current generation circuit (a write source) 2 that generates a write current and a sink circuit 3 that absorbs the write current. Additionally, the write circuit 55 also includes a control circuit 4, and the control circuit 4 controls operations of the write current generation circuit 2 and the sink circuit 3.

Likewise, one end of the bit line 42 is connected with a write circuit 57 through a switch circuit 56 such as a transistor (FET). The write circuit 57 includes a write current generation circuit (a write source) 2 that generates a write current and a sink circuit that absorbs the write current. The write circuit 57 includes a control circuit 4 that controls operations of the write current generation circuit 2 and the sink circuit 3.

The write current generation circuit 2 outputs the write current Iw or Iw' having a waveform depicted in FIG. 3 or 7.

Further, the other end of the bit line 42 is connected with a read circuit 52. The read circuit 52 includes a constant current source which generates a read current, a sense amplifier, and other parts.

At the time of writing, the switch circuit 54 and 56 connected with the memory cell MC selected as a write target is turned on, and the other switch circuits are turned off. Furthermore, the select transistor ST in the selected memory cell MC is turned on.

Moreover, the write current flowing in a direction associated with data to be written is supplied to the memory cell MC. For example, when writing "1", the write current is flowed toward the write circuit (the sink side) 57 from the write circuit (the source side) 55. When writing "0", the write current is flowed toward the write circuit (the sink side) 55 from the write circuit (the source side) 57.

In this example, as shown in, e.g., FIG. 3, the write current Iw has a pulse shape in which a falling period Tf is longer than a rising period Tr, and this write current Iw is flowed through the magnetoresistive effect element 1 in the selected memory cell MC. This write current Iw outputs a first current value i1 constantly during a predetermined period $t_2$-$t_3$. It is to be noted that the write current Iw has a pulse width $W_P$ falling within the range of, e.g., several nanoseconds to several microseconds in accordance with a write operation cycle of the magnetoresistive random access memory.

At the time of reading, the switch circuit 54 connected with the memory cell MC selected as a read target is turned on, and the other switch circuits are turned off. Additionally, the select transistor ST in the selected memory cell MC is turned on.

Figure 10:
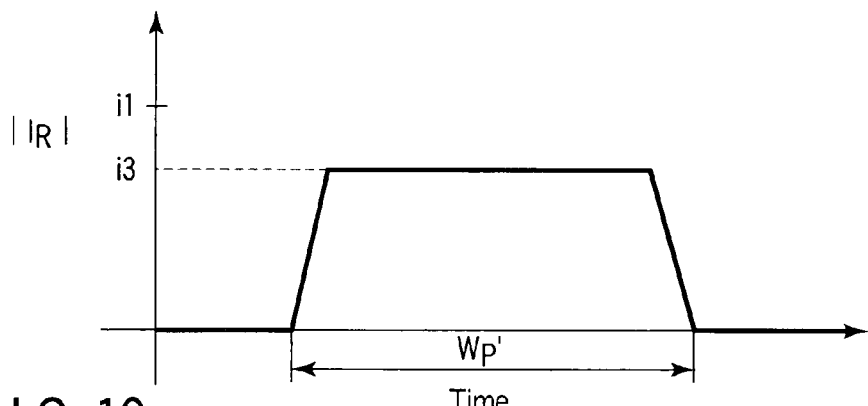
FIG. 10 is a view showing a waveform of a read current.

Further, a read current is supplied to the selected memory cell MC. As shown in FIG. 10, as the read current Ir, a pulse current having a rectangular shape is used, differing from the write current Iw. Note that the read current Ir is represented by an absolute value in FIG. 10.

The read current Ir is assumed to have a value i3 which is sufficiently smaller than the current value i1 used for the write current Iw in order to prevent magnetization reversal (switching) from occurring due to the read current Ir. Incidentally, when using the write current Iw' having, e.g., a waveform shown in FIG. 7, it is preferable for the current value i3 to be smaller than the current value i2. Furthermore, it is preferable for a pulse width $W_P'$ of the read current of the read current to be shorter than a pulse width $W_P$ of the write current.

The magnetoresistive random access memory is constituted of the plurality of magnetoresistive effect elements (the MTJ elements) 1, and characteristics fluctuate in accordance with each of these MTJ elements. As one of such fluctuations in element characteristics, there is a fluctuation in a threshold reversing current in one memory cell array. That is, the magnetoresistive effect element 1 having a small threshold reversing current and the magnetoresistive effect element 1 having a large threshold reversing current are included in the memory cell array. To avoid a situation where data cannot be written because the current value is small, the current value of the write current Iw is set to a maximum value in, e.g., a distribution of fluctuations in threshold reversing current while considering the presence of the magnetoresistive effect element having a large threshold reversing current.

Therefore, the write current Iw has an excessive current value with respect to the magnetoresistive effect element 1 having a small (minimum) threshold reversing current, and the write current flows into an erroneous write region (see FIG. 4) with respect to this magnetoresistive effect element 1.

However, when the write current Iw having a falling period Tf longer than a rising period Tr is used as in this example, the current passes through a write region (a normal parallel/antiparallel state) for the long period Tf, i.e., a time (a period) during which a current value suitable for writing can be supplied is present in the falling period Tf, thereby suppressing an adverse effect of thermal disturbance. As a result, the probability that writing is normally terminated is increased.

Therefore, according to this embodiment, stable data writing based on spin transfer magnetization reversal with less occurrence of erroneous writing can be realized.

As described above, in the magnetoresistive random access memory (the MRAM) as the application example of this embodiment, the write current Iw for data writing has a longer falling period Tf than rising period Tr, as shown in FIG. 3, for example.

As a result, the MRAM according to this application example can suppress erroneous writing due to an excessive write current and realize stable data writing based on spin transfer magnetization reversal.

(b) Structural Example of Write Circuit

A structural example of a write circuit that outputs a write current having a falling period longer than a rising period will now be described with reference to FIGS. 11 to 16.

(b-1) Circuit Example 1

A circuit configuration that outputs the write current Iw depicted in FIG. 3 will now be explained with reference to FIGS. 11 to 14.

Figure 11:
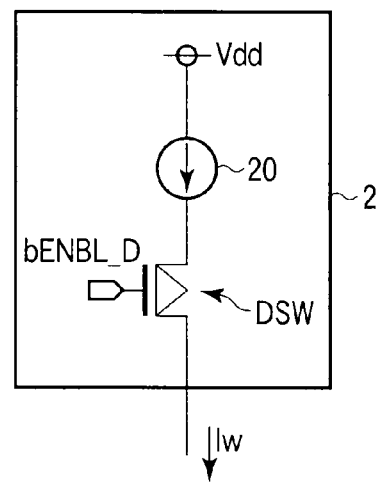
FIGS. 11, 12 and 13 are views, each showing an example of an inner configuration of a write circuit.
Figure 12:
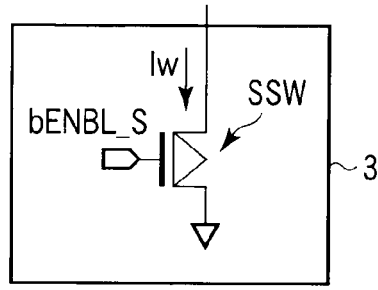
Figure 13:
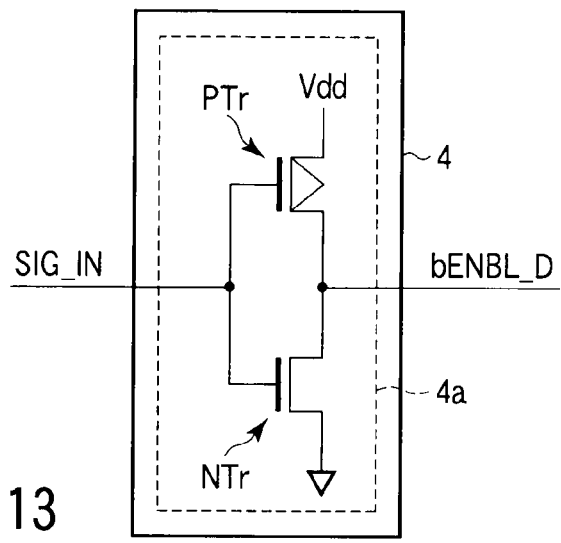

FIG. 11 shows an example of a circuit configuration of a write current generation circuit 2 provided in a write circuit 55 and 57. FIG. 12 shows an example of a circuit configuration of a sink circuit 3 provided in the write circuit 55 and 57. Further, FIG. 13 shows an example of a circuit configuration of a control circuit 4 provided in the write circuit 55 and 57.

As shown in FIG. 11, the write current generation circuit 2 which generates the write current Iw includes one constant current source 20 and one switch element DSW.

One end (an output side) of the constant current source 20 is connected with one end of the switch element DSW, and the other end of the source 20 is connected with a power supply which outputs a constant voltage value Vdd.

The switch element DSW is connected with a bit line 32 or 42 through a switch circuit 54 or 56. An operation of the switch element DSW is controlled based on a control signal bENBL_D. The switch element DSW is, e.g., a field-effect transistor (FET), and a p-channel MOS transistor is used in this example.

As shown in FIG. 12, the sink circuit 3, which absorbs the write current Iw, has one switch element SSW, and this switch element SSW is connected with the bit line 32 or 42 through the switch circuit 54 or 56.

An operation of the switch element SSW is controlled based on a signal bENBL_S different from the control signal bENBL_D. The switch element SSW is, e.g., a field-effect transistor, and an n-channel MOS transistor is used in this example.

The control circuit 4 depicted in FIG. 13 controls an operation of the write current generation circuit 2. As shown in FIG. 12, the control circuit 4 has, e.g., an inverter 4a as a control element. The inverter 4a outputs a control signal bENBL_D based on a signal SIG_IN input into the control circuit 4.

This inverter 4a is, e.g., a CMOS inverter, and is formed of a p-channel MOS transistor PTr and an re-channel MOS transistor NTr. Usually, current drives (driving force) are designed in such a manner that the p-channel/n-channel MOS transistors constituting the CMOS inverter can have the same response speed. However, in this embodiment, current drives W<NTr> and W<PTr> of the respective transistors NTr and PTr are set in such a manner that the p-channel MOS transistor PTr and the n-channel MOS transistor NTr can have different response speeds. For example, the n-channel MOS transistor NTr is driven with a current drive W<NTr>=N, and the p-channel MOS transistor PTr is driven with a current drive W<PTr>=N/4. Note that, in a regular CMOS inverter, the n-channel MOS transistor is driven with the current drive W<NTr>=N and the p-channel MOS transistor is driven with the current drive W<PTr>=2N.

As explained above, when writing data, the write current generation circuit 2 on the source side flows the write current Iw toward the sink circuit 3 on the sink side. The write current Iw output by the circuits 2, 3, or 4 having the configuration depicted in each of FIGS. 11 to 13 becomes the write current Iw having the pulse shape depicted in FIG. 3. An operation of the write circuit 55 or 57 when writing data according to this example will now be described with reference to FIG. 14.

Figure 14:
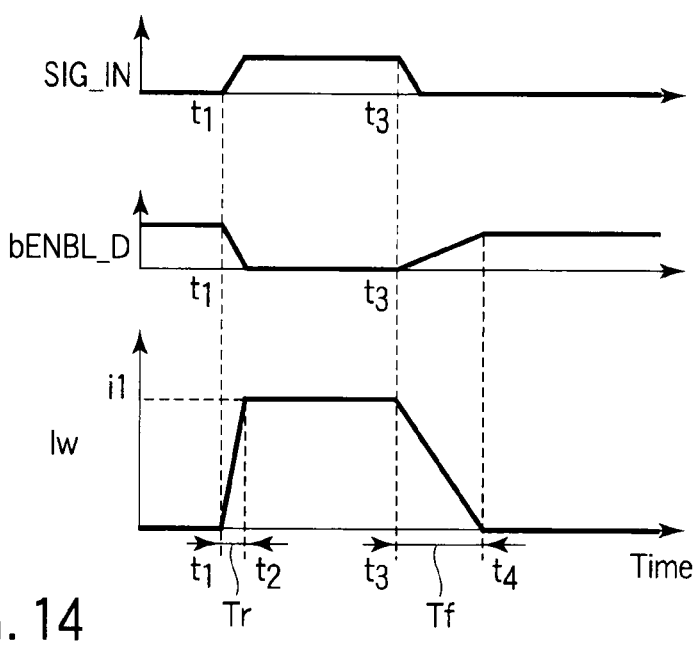
FIG. 14 is a timing chart showing an example of an operation of the write circuit.

FIG. 14 shows a timing chart (voltage waveforms) of control signals SIG_IN and bENBL_D which control operations of the write circuit 55 or 57. FIG. 14 also shows an output waveform (a current waveform) of the write current Iw.

When writing data in the magnetoresistive effect element 1 in a selected memory cell, the write circuit 55 or 57 is driven based on the control signal SIG_IN.

The control signal SIG_IN is input to the control circuit 4, and the control signal bENBL_D that controls the write current generation circuit 2 changes from an "H (high)" level to an "L (low)" level when the signal SIG_IN changes from the "L" level to the "H" level. A falling edge of the control signal bENBL_D varies from the "H" level to the "L" level in a response time associated with the current drive W<NTr> of the n-channel MOS transistor NTr constituting the inverter 4a. At this time, the p-channel MOS transistor PTr constituting the inverter 4a functions as a load with respect to an operation of the inverter 4a.

The switch element (the p-channel MOS transistor) DSW in the write current generation circuit 2 is turned on based on this control signal bENBL_D. At the same time, the switch element (the n-channel MOS transistor) in the sink circuit 3 is also turned on.

As a result, the write current is output from the constant current source 20 to the magnetoresistive element 1, and the current which has passed through the magnetoresistive effect element is absorbed by the sink circuit 3.

The write current Iw has the predetermined current value i1 during the rising period Tr ($t_1$-$t_2$). Further, when the predetermined time (the falling start time) $t_3$ at which writing data into the magnetoresistive effect element 1 is completed is reached, the control signal SIG_IN is changed from the "H" level to the "L" level.

With this change, the control signal bENBL_D also starts switching from the "L" level to the "H" level. At this time, in the inverter 4a, when the control signal bENBL_D switches from the "H" level to the "L" level, the current drive W<NTr> of the n-channel MOS transistor NTr functions with respect to this switching, and the control signal bENBL_D falls at a response speed associated with this current drive W<NTr>. Furthermore, in the inverter 4a, in case of switching the control signal bENBL_D from the "L" level to the "H" level, the current drive W<PTr> of the p-channel MOS transistor PTr functions with respect to this switching, and the control signal bENBL_D switches from the "L" level to the "H" level at a response speed associated with this current drive W<PTr>.

As explained above, in this example, the current drive of the p-channel MOS transistor is set to have a smaller value than that in a regular case, and the re-channel MOS transistor NTr and the p-channel MOS transistor PTr have different response speeds. Therefore, when the control signal bENBL_D changes from the "L" level to the "H" level, the response speed of the control signal bENBL_D is dependent on the current drive of the p-channel MOS transistor PTr. Accordingly, comparing with when the control signal bENBL_D changes from the "H" level to the "L" level, delay occurs when the control signal bENBL_D changes from the "L" level to the "H" level. It is to be noted that the n-channel MOS transistor NTr constituting the inverter 4a functions as a load with respect to the inverter 4a when the control signal bENBL_D changes from the "L" level to the "H" level.

In this case, since the write current generation circuit 2 (the switch element DSW) operates in accordance with the control signal bENBL_D, the current value i1 changes to 0 in the falling period Tf ($t_3$-$t_4$) of the write current Iw behind the rising period Tr of the same. Therefore, the write current Iw has a longer falling period Tf than rising period Tr.

As explained above, the write current Iw shown in FIG. 3 is generated by the write current generation circuit 2 and the control circuit 4 and output from the write circuit 55 or 57.

Therefore, it is possible to provide a magnetoresistive random access memory that can realize stable data writing based on spin transfer magnetization reversal with less occurrence of erroneous writing.

It is to be noted that, as a method of setting the current drive, adjustment or the like of a potential Vdd which is given to one end of a current path of the MOS transistor PTr is used, for example. Therefore, even when the write current according to the embodiment of the present invention is applied, a circuit scale of the write circuit 55 or 57 is not increased.

Further, the configuration that generates the write current Iw shown in FIG. 3 is not restricted to the above-described configuration. For example, a delay circuit may be added to the sink circuit 3. It is to be noted that a configuration of the control circuit 4 (the inverter 4a) is a regular configuration.

In this case, the delay circuit in the sink circuit 3 is turned off in a period from the time $t_1$ to the time $t_3$. Furthermore, the delay circuit is turned on when the control signal SIG_IN switches from the "H" level to the "L" level (the time $t_3$). The delay circuits delays the falling edge of the write current Iw, and the falling period Tf thereby becomes longer than the rising period Tr. Even in this case, the write current Iw depicted in FIG. 3 is output from the write circuit 55 or 57.

(b-2) Circuit Example 2

A circuit configuration that outputs the write current Iw' depicted in FIG. 7 will now be described with reference to FIGS. 15 and 16.

Figure 15:
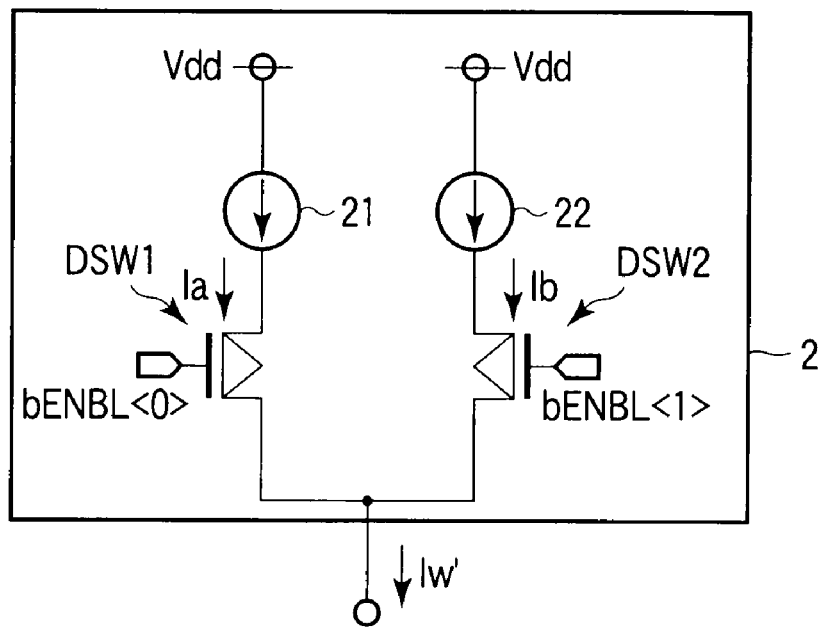
FIG. 15 is a view showing an example of the inner configuration of the write circuit.

A write current generation circuit 2 in the example depicted in FIG. 15 outputs, e.g., the write current Iw' shown in FIG. 7.

The write current generation circuit 2 depicted in FIG. 15 is constituted of two constant current sources 21 and 22 and a plurality of switch elements DSW1 and DSW2 (two in this example).

The first constant current source 21 outputs a constant current Ia, and the second constant current source 22 outputs a constant current Ib.

One end (an output side) of the first constant current source 21 is connected with the first switch element DSW1, and one end (an output side) of the second constant current source 22 is connected with the second switch element DSW2. The other ends of the first and second constant current sources 21 and 22 are connected with power supplies that supply constant voltage Vdd.

Each of the switch elements DSW1 and the DSW2 is, e.g., a field-effect transistor (FET), and a p-channel MOS (Metal-Oxide-Insulator) transistor is used in this example. Operations of the switch elements DSW1 and DSW2 are controlled by control signals bENBL<0> and bENBL<1>, respectively.

The write current Iw' generated by the write current generation circuit 2 is output from the write circuit 55 or 57. An operation of the write circuit 55 or 57 at the time of data writing in this example will now be described with reference to FIG. 16.

Figure 16:
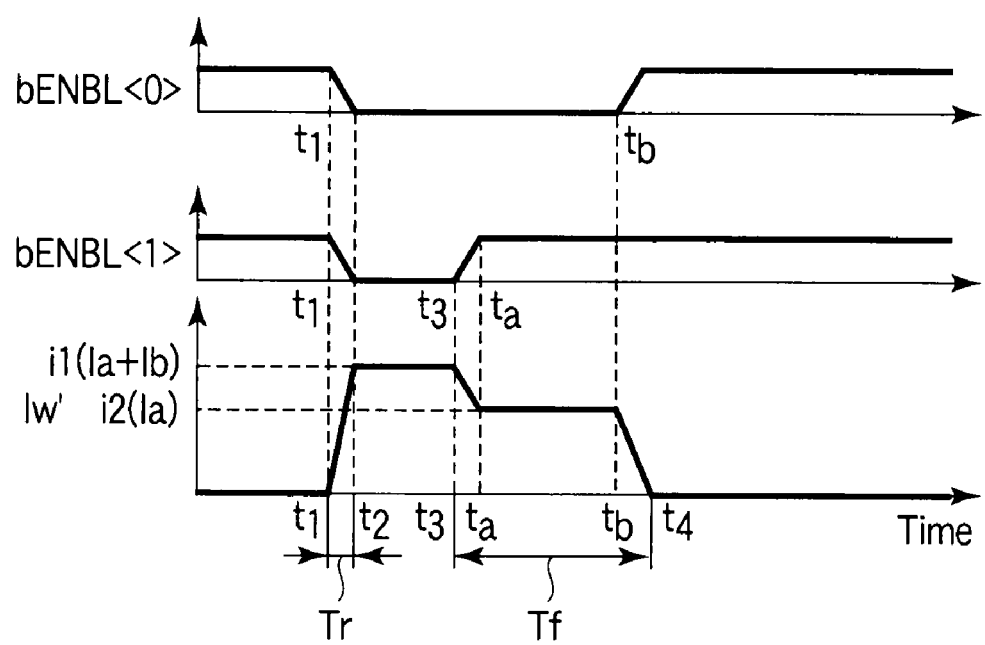
FIG. 16 is a timing chart showing an example of an operation of the write circuit.

FIG. 16 shows a timing chart (voltage waveforms) of the control signals bENBL<0> and bENBL<1>. Further, FIG. 16 also shows an output waveform (a current waveform) of the write current Iw'.

When writing data with respect to the magnetoresistive effect element in a selected memory cell, as shown in FIG. 16, the control signals bENBL<0> and bENBL<1> switch from the "H" level to the "L" level at a time $t_1$. As a result, the two switch elements DSW1 and DSW2 are turned on, and the currents Ia and Ib are output to the magnetoresistive effect element 1 from the two constant current sources 21 and 22, respectively.

Moreover, a current value of the write current Iw' changes to a first current value i1 through the rising period Tr ($t_1$-$t_2$). This current value i1 is a current value corresponding to a sum of the two currents Ia and Ib. The first current value i1 is output constant during a period from a rising end time $t_2$ to a falling start time $t_3$.

After the current having the current value it is output during the predetermined period $t_2$-$t_3$, when a time $t_3$ at which writing data with respect to the magnetoresistive effect element 1 is completed (the falling start time) is reached, the control signal bENBL<1> switches from the "L" level to the "H"

level. The second switch element DSW2 is turned off, and the ON state of the first switch element DSW1 alone is maintained.

As a result, the supply of the current from the second constant current source 22 is stopped, and the current value of the write current Iw' becomes a current value i2 associated with the current Ia output from the first constant current source 21.

Furthermore, the current having the current value i2 is supplied constantly to the magnetoresistive effect element during a period from a time $t_a$ to a time $t_b$. After the current value i2 is output in during the predetermined period $t_a$-$t_b$, the control signal bENBL<0> switches from the "L" level to the "H" level, and the first switch element DSW1 is turned off at the time $t_b$. As a result, the supply of the current from the first constant current source 21 is stopped, and the current value of the write current Iw' becomes 0 after a period $t_b$-$t_4$.

It is to be noted that, in a relationship between the currents Ia and Ib and the current values i1 and i2 output from the constant current sources 21 and 22, for example, the current Ia may represent the current value i2 whilst the current Ib may represent the current value i1 instead of representing the current value i1, which is the sum of the two currents Ia and Ib.

In this case, during the period $t_2$-$t_3$, the second switch element DSW2 alone is turned on and the current Ib having the current value i1 is output from the second constant current source 22 to the magnetoresistive effect element 1. Additionally, during the period $t_a$-$t_b$, the first switch element DSW1 alone is turned on and the current Ia having the current value i2 is output to the magnetoresistive effect element 1 from the first constant current source 21.

As explained above, the write current generation circuit depicted in FIG. 15 can generate a write current Iw' which a falling period Tf is longer than rising period Tr.

Therefore, it is possible to provide the magnetoresistive random access memory which can realize stable data writing based on spin transfer magnetization reversal with less erroneous writing.

CONCLUSION

According to the example of the present invention, stable data writing based on spin transfer magnetization reversal with less occurrence of erroneous writing can be realized.

Although the example of application to a magnetoresistive random access memory has been described above as an example according to the present invention, the present invention can be also applied to general memories utilizing the TMR effect.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic memory comprising:
a plurality of memory cells each including a magnetoresistive effect element which comprises a first magnetic layer having an invariable magnetizing direction, a second magnetic layer having a variable magnetizing direction, and a tunnel barrier layer provided between the first magnetic layer and the second magnetic layer; and
a write circuit which includes a write current generation circuit that generates a write current to change the magnetizing direction of the second magnetic layer, which includes a control circuit which controls an operation of the write current generation circuit, the control circuit comprising an inverter comprising a p-channel field-effect transistor and an n-channel field-effect transistor, the p-channel field-effect transistor having a driving force smaller than a driving force of the n-channel field-effect transistor, and which flows the write current through the magnetoresistive effect element bidirectionally,
wherein the write circuit flows the write current in which a falling period from the start of a falling edge to the end of the falling edge is longer than a rising period from the start of a rising edge to the end of the rising edge,
wherein the rising period of the write current is controlled based on a response speed associated with the driving force of the n-channel field-effect transistor, and
the falling period of the write current is controlled based on a response speed associated with the driving force of the p-channel field-effect transistor.

2. The memory according to claim 1, wherein the write circuit outputs a predetermined current value as current value of the write current,
the predetermined current value is constant during a period from the end of the rising edge to the start of the falling edge, and is equal to or above values of threshold reversing currents of the plurality of memory cells.

3. The memory according to claim 2, wherein the write current generation circuit has a constant current source which outputs a current having the predetermined current value.

4. The memory according to claim 2, further comprising:
a read circuit which generates a read current to read data from a magnetoresistive effect element,
wherein the read current has a rising period and falling period which are equal to each other, and has a current value smaller than the values of threshold reversing currents of the plurality of memory cells.

5. The memory according to claim 1, wherein the write circuit outputs a first current value and a second current value smaller than the first current value as current values of the write current,
the first current value is constant during a period from the end of the rising edge to the start of the falling edge, and
the second current value is constant during a part of the falling period.

6. The memory according to claim 5, wherein the write current generation circuit comprises:
a first constant current source which outputs a first current; and
a second constant current source which outputs a second current,
wherein the first current value is generated based on a sum of the first current and the second current, and the second current value is generated based on the first current.

7. The memory according to claim 5, wherein the first current value is equal to or above the values of the threshold reversing currents of the plurality of memory cells.

8. The memory according to claim 5, further comprising:
a read circuit which generates a read current to read data from a magnetoresistive effect element,
wherein the read current has a rising period and a falling period which are equal to each other, and has a current value smaller than the second current value.

9. The memory according to claim 1, wherein a ratio of the falling period and the rising period is 2.5 or above.

10. The memory according to claim 1, wherein the magnetoresistive effect element has a magnetic tunnel junction.

* * * * *